United States Patent
Mikami

(10) Patent No.: US 11,043,363 B2
(45) Date of Patent: Jun. 22, 2021

(54) PLASMA PROCESSING METHOD AND PLASMA PROCESSING APPARATUS

(71) Applicant: Tokyo Electron Limited, Tokyo (JP)

(72) Inventor: Hirotaka Mikami, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/801,595

(22) Filed: Feb. 26, 2020

(65) Prior Publication Data
US 2020/0273673 A1    Aug. 27, 2020

(30) Foreign Application Priority Data

Feb. 27, 2019    (JP) .............................. JP2019-034837

(51) Int. Cl.
   *H01J 37/32*    (2006.01)

(52) U.S. Cl.
   CPC .... *H01J 37/32449* (2013.01); *H01J 37/3255* (2013.01); *H01J 37/32082* (2013.01); *H01J 37/32633* (2013.01); *H01J 37/32651* (2013.01); *H01J 2237/334* (2013.01)

(58) Field of Classification Search
   CPC ........... H01J 37/32082; H01J 37/32449; H01J 37/3255; H01J 37/32633; H01J 37/32651; H01J 2237/334; H01J 37/32431; H01J 37/32477
   See application file for complete search history.

(56) References Cited

U.S. PATENT DOCUMENTS

| | | | |
|---|---|---|---|
| 10,184,173 B1 * | 1/2019 | Yonemoto | C23C 16/4404 |
| 2007/0004220 A1 * | 1/2007 | Tran Quoc | H01L 21/02422 |
| | | | 438/758 |
| 2007/0163617 A1 * | 7/2007 | Ozaki | B08B 7/0035 |
| | | | 134/1.1 |
| 2007/0204797 A1 * | 9/2007 | Fischer | H01J 37/32642 |
| | | | 118/723 R |
| 2016/0303620 A1 * | 10/2016 | Kim | C23C 16/4405 |
| 2016/0315005 A1 * | 10/2016 | Harada | H01J 37/32449 |
| 2017/0076956 A1 * | 3/2017 | Hirayama | H01J 37/32449 |
| 2017/0148610 A1 * | 5/2017 | Wada | H01L 21/31144 |
| 2017/0316919 A1 * | 11/2017 | Hirayama | H01J 37/32082 |

FOREIGN PATENT DOCUMENTS

JP    2014-204001    10/2014

* cited by examiner

*Primary Examiner* — Kurtis R Bahr
(74) *Attorney, Agent, or Firm* — IPUSA, PLLC

(57) ABSTRACT

A plasma processing method is performed by a plasma processing apparatus that includes a process chamber, a conductive first component that is disposed in the process chamber and at least a surface of which is covered with a conductive silicon material, and a second component that is disposed in the process chamber and is at a ground potential or a floating potential with respect to an electric potential of plasma. The method includes forming an oxide layer on the surface of the first component by converting an oxygen-containing gas into plasm, and treating a surface of the second component by converting a halogen-containing gas into plasm.

11 Claims, 7 Drawing Sheets

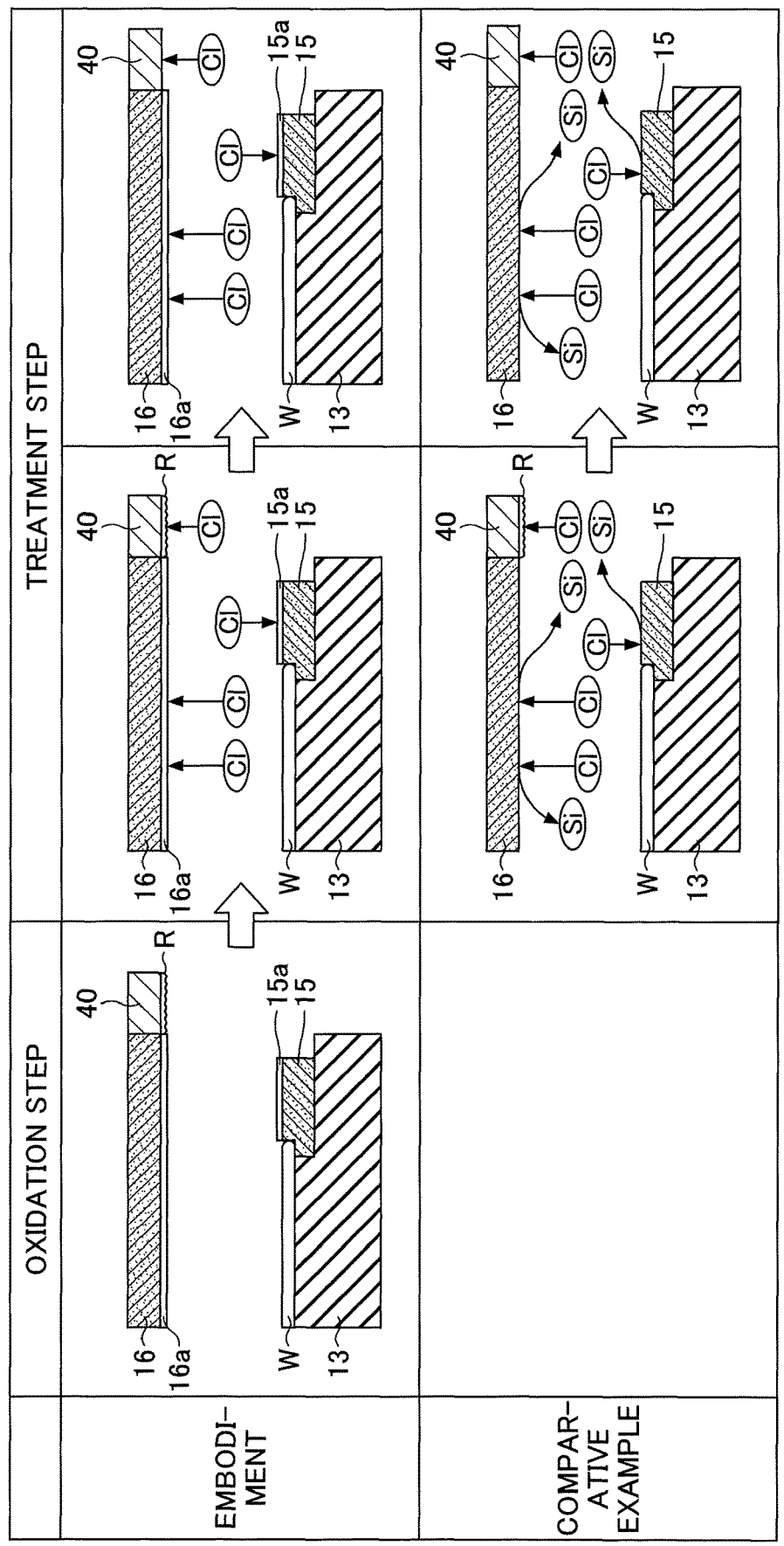

FIG.3

| SEM IMAGE (AFTER TREATMENT) | SHOWER HEAD | INSULATOR |
|---|---|---|
| | 200, 201, 202, 203 | 200, 201, 202, 203 |
| XPS [Atm%] | Al (2p) : 34.24<br>F (1s) : 23.84<br>Si (2p) : 0.14<br>O (1s) : 29.91<br>C (1s) : 11.70 | Al (2p) : 28.72<br>F (1s) : 36.37<br>Si (2p) : 0.08<br>O (1s) : 19.52<br>C (1s) : 15.25 |

FIG.5

| ETCHING RATE / COMPONENT | EMBODIMENT | | | | COMPARATIVE EXAMPLE | | | |
|---|---|---|---|---|---|---|---|---|
| | $Al_2O_3$ | Poly-Si | SELECTIVITY | | $Al_2O_3$ | Poly-Si | SELECTIVITY | |
| SHOWER HEAD (UPPER ELECTRODE) | 2.8 | 0.9 | 3.2 | | 2.5 | 2.7 | 0.9 | |
| INSULATOR | 1.2 | 0.1 | 9.7 | | 1.1 | 0.1 | 9.8 | |
| DEPOSIT SHIELD | 0.5 | 0.4 | 1.2 | | 0.4 | 0.2 | 1.8 | |

PLASMA PROCESSING METHOD AND PLASMA PROCESSING APPARATUS

CROSS-REFERENCE TO RELATED APPLICATION

The present application is based upon and claims priority to Japanese Patent Application No. 2019-034837, filed on Feb. 27, 2019, the entire contents of which are incorporated herein by reference.

BACKGROUND OF THE INVENTION

1. Field of the Invention

An aspect of this disclosure relates to a plasma processing method and a plasma processing apparatus.

2. Description of the Related Art

For example, Japanese Laid-Open Patent Publication No. 2014-204001 proposes a technology for removing Ti-containing deposits adhered to the side wall of a chamber during the etching of a film below a TiN mask to suppress degradation over time of etching characteristics due to metal deposits.

SUMMARY OF THE INVENTION

In an aspect of this disclosure, there is provided a plasma processing method performed by a plasma processing apparatus that includes a process chamber, a conductive first component that is disposed in the process chamber and at least a surface of which is covered with a conductive silicon material, and a second component that is disposed in the process chamber and is at a ground potential or a floating potential with respect to an electric potential of plasma. The method includes forming an oxide layer on the surface of the first component by converting an oxygen-containing gas into plasm, and treating a surface of the second component by converting a halogen-containing gas into plasm.

BRIEF DESCRIPTION OF THE DRAWINGS

FIG. 2 is a drawing illustrating effects of an oxidation step and a treatment step according to an embodiment;

FIG. 3 is a drawing illustrating examples of compositions of metal deposits formed as a result of an etching step according to an embodiment;

FIG. 5 is a table indicating the results of experiments; and

DESCRIPTION OF THE PREFERRED EMBODIMENTS

An aspect of this disclosure provides a technology that makes it possible to remove a metal-containing deposit adhering to a second component at a ground potential or a floating potential while reducing wear of a conductive first component.

Embodiments of the present invention are described below with reference to the accompanying drawings. The same reference number may be assigned to the same component throughout the drawings, and repeated descriptions of the same component may be omitted.

<Plasma Processing Apparatus>

First, a plasma processing apparatus 10 that performs a plasma processing method of an embodiment is described with reference to FIG. 1. FIGS. 1A and 1B are cross-sectional views illustrating exemplary configurations of a plasma processing apparatus 10 according to an embodiment. In the present embodiment, the plasma processing apparatus 10 is implemented by a parallel-plate type capacitively coupled plasma (CCP) processing apparatus.

Figure 1A:
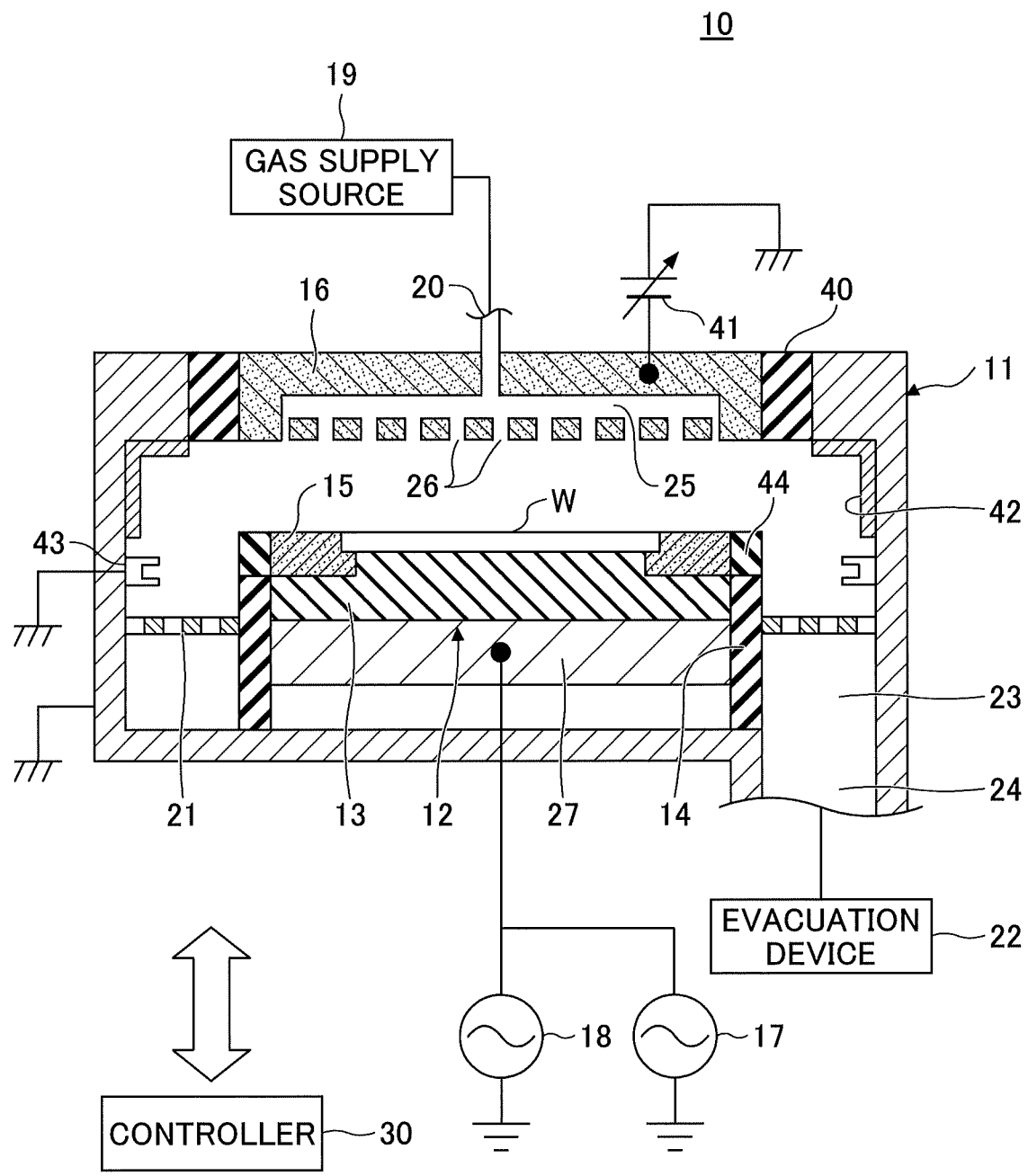
FIGS. 1A and 1B are cross-sectional views illustrating exemplary configurations of a plasma processing apparatus according to an embodiment.

First, the configuration of the plasma processing apparatus 10 illustrated in FIG. 1A is described. The plasma processing apparatus 10 includes a process chamber 11 and a stage 12 disposed in the process chamber 11. The process chamber 11 is, for example, a cylindrical container formed of aluminum (Al) whose surface is alumite-treated (anodized). The process chamber 11 is grounded. The stage 12 includes a base 27 and an electrostatic chuck 13 disposed on the base 27. The stage 12 is disposed on the bottom of the process chamber 11 via a support 14 formed of an insulating material.

The base 27 is formed of, for example, aluminum. The electrostatic chuck 13 is formed of a dielectric material such as alumina ($Al_2O_3$) and includes a mechanism for holding a wafer W with electrostatic attraction. An annular edge ring 15 (also called a focus ring) is provided on the periphery of the upper side of the electrostatic chuck 13 to surround the circumference of the wafer W. A protective part 44 formed of an insulating material is provided on the outer periphery of the edge ring 15 to protect the side surface of the edge ring 15 and the upper surface of the support 14 from plasma.

An annular exhaust path 23 is formed between the inner wall of the process chamber 11 and the outer wall of the stage 12 and is connected to an evacuation device 22 via an exhaust port 24. The evacuation device 22 is implemented by a vacuum pump such as a turbo molecular pump or a dry pump. The evacuation device 22 discharges gas from the process chamber 11 through the exhaust path 23 and the exhaust port 24. Thus, the evacuation device 22 reduces the pressure of a process space in the process chamber 11 to a predetermined vacuum.

A baffle plate 21 is provided in the exhaust path 23 between the support 14 and the inner wall of the process chamber 11. The baffle plate 21 separates the process space from the exhaust space and controls the flow of gas. The baffle plate 21 is produced by, for example, forming a corrosion-resistant film (e.g., yttrium oxide ($Y_2O_3$)) on the surface of a base part formed of aluminum. Multiple through holes are formed in the baffle plate 21.

The stage 12 is connected to a first radio-frequency power supply 17 and a second radio-frequency power supply 18. The first radio-frequency power supply 17 applies, to the stage 12, radio-frequency power (which may be hereafter referred to as "HF power") that is used for plasma generation and has a frequency of, for example, 60 MHz. The second radio-frequency power supply 18 applies, to the stage 12, radio-frequency power (which may be hereafter referred to as "LF power") that is used to generate a bias voltage capable of attracting ions and has a frequency of, for example, 13 MHz. With this configuration, the stage 12 also functions as a lower electrode. Although the second radio-frequency power supply 18 is used to generate a bias voltage capable of attracting ions, a portion of the applied LF power may also contribute to plasma generation. Also, although the first radio-frequency power supply 17 is for plasma generation, a portion of the applied HF power may also contribute to attraction of ions.

A shower head 16 is fitted in an opening in the ceiling of the process chamber 11 via a ring-shaped insulator 40 surrounding the shower head 16. The HF power is applied to a "capacitor" formed between the stage 12 and the shower head 16. A variable direct-current power supply 41 is connected to the shower head 16. When a negative direct-current voltage is applied from the variable direct-current power supply 41 to the shower head 16, a bias voltage is applied to the shower head 16, and ions are attracted to the shower head 16.

Specifically, plasma is generated from a gas mainly using the HF power. Ions in the plasma are attracted to the shower head 16 by the direct-current voltage applied to the shower head 16 and collide with the shower head 16. As a result, the shower head 16 is sputtered with the ions. Also, ions in the plasma are attracted to the stage 12 by the LF power applied to the stage 12 and collide with the wafer W and the edge ring 15 placed on the stage 12. As a result, a film on the wafer W and the edge ring 15 are sputtered by the ions. Also, a mechanism for applying a direct-current voltage to the edge ring 15 may be provided so that ions are attracted to the edge ring 15 by the direct-current voltage applied to the edge ring 15 and collide with and sputter the edge ring 15.

A gas source 19 supplies gases corresponding to process conditions of plasma processing steps including an etching step, an oxidation step, a treatment step, and a sputtering step.

A gas supplied from the gas source 19 enters a gas diffusion chamber 25 of the shower head 16 via a gas line 20 and is introduced into the process chamber 11 like a shower through multiple gas holes 26.

A deposit shield 42 is detachably attached to the inner wall of the process chamber 11. The deposit shield 42 prevents deposits generated during plasma processing from adhering to the inner wall of the process chamber 11. The deposit shield 42 is produced by, for example, forming a corrosion-resistant film on the surface of a base part formed of aluminum. The corrosion-resistant film may be formed of ceramics such as yttrium oxide. The deposit shield 42 may also be provided on the outer circumferential surface of the support 14 and the exhaust path 23.

A ring-shaped grounding part 43 is provided on and protrudes from the side wall of the process chamber 11. The grounding part 43 is electrically grounded and is formed of a conductive material such as silicon. In the process chamber 11, electrons generated as a result of, for example, the direct-current voltage applied to the shower head 16 are introduced into the grounding part 43.

Figure 1B:
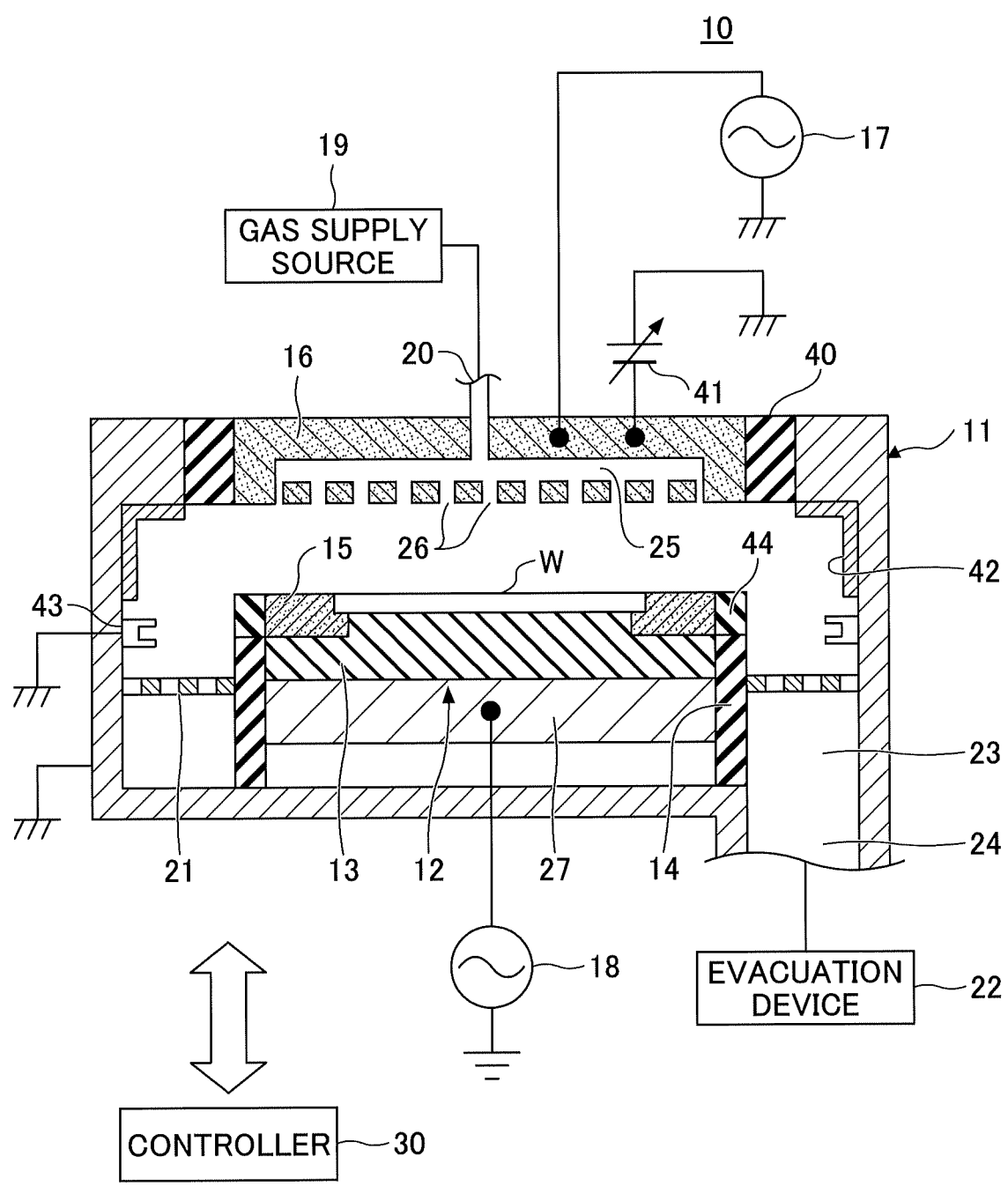

The plasma processing apparatus 10 illustrated in FIG. 1B has substantially the same configuration as the plasma processing apparatus 10 illustrated in FIG. 1A except for the position of the first radio-frequency power supply 17. In the plasma processing apparatus 10 illustrated in FIG. 1B, the first radio-frequency power supply 17 is connected to the shower head 16. The first radio-frequency power supply 17 applies HF power with a frequency of, for example, 60 MHz to the shower head 16.

A controller 30 includes a central processing unit (CPU), a read-only memory (ROM), and a random access memory (RAM). The controller 30 controls various plasma processing steps and controls the entire plasma processing apparatus 10 according to procedures defined in recipes stored in the RAM.

When plasma processing is performed with the plasma processing apparatus 10 configured as described above, the wafer W held on a conveying arm is carried via a gate valve into the process chamber 11. The wafer W is mounted on the electrostatic chuck 13. After the wafer W is carried into the process chamber 11, the gate valve is closed. When a direct-current voltage is applied to an electrode of the electrostatic chuck 13, the wafer W is electrostatically attracted to and held on the electrostatic chuck 13 by Coulomb force.

The pressure in the process chamber 11 is reduced to a set value by the evacuation device 22, and the inside of the process chamber 11 is maintained in a vacuum state. A gas is introduced in the form of a shower via the shower head 16 into the process chamber 11. The HF power and the LF power are applied to the stage 12. Also, a direct-current voltage may be applied to the shower head 16.

Plasma is generated from the introduced gas mainly using the HF power, and plasma processing such as etching is performed on the wafer W by using the plasma. After the plasma processing is completed, the wafer W is held on the conveying arm and carried out of the process chamber 11. The above process is repeated to process multiple wafers W in succession.

The shower head 16 and the edge ring 15 of the plasma processing apparatus 10 are examples of a first component that is conductive and at least a surface of which is covered with a conductive silicon material. The first component may be formed of a conductive silicon material such as Si, SiC, amorphous silicon (α-Si), or polysilicon (poly-Si). At least the surface of the first component may be formed of such a conductive silicon material. For example, the first component may be formed by coating a component with a conductive silicon material by, for example, thermal spraying. The first component is formed of a conductive material such as silicon or a silicon-containing material and does not include insulating materials such as a silicon dioxide film ($SiO_2$) and a silicon nitride film (SiN). In the example of the present embodiment, the shower head 16 and the edge ring 15 are formed of silicon.

Also, the insulator 40, the deposit shield 42, the baffle plate 21, the protective part 44, and the grounding part 43 are examples of a second component that is at a ground potential or a floating potential with respect to the electric potential of plasma. The deposit shield 42, the baffle plate 21, and the grounding part 43 are examples of a second component that is at a ground potential with respect to the electric potential of plasma. The insulator 40 and the protective part 44 are examples of a second component that is at a floating potential with respect to the electric potential of plasma.

<Metal Deposits>

Due to the increasing complexity and fineness of semiconductor structures in recent years, even an extremely small byproduct (reaction product) generated during plasma processing may greatly influence a semiconductor chip produced as a final product.

Particularly, when a metal-containing component is plasma-etched, a metal is included in the byproduct. For example, when a silicon-containing film is formed below a mask made of titanium nitride (TiN) and the silicon-containing film is plasma-etched through the mask, titanium (Ti) contained in the mask is scraped off and included in the byproduct. Unlike materials other than metals, metal materials such as Ti, Al, and Zr included in byproducts cannot be readily removed.

When a metal-containing byproduct adheres to and accumulates in the process chamber 11, the byproduct becomes a metal-containing deposit (which is hereafter referred to as a "metal deposit"). The metal deposit may be a transition metal. A metal deposit may become a particle on a substrate, change the impedance of the process chamber 11, and/or change the interaction between the wall and radical species, and may thereby deteriorate the etching process over time. For this reason, it is important to remove metal deposits adhering to the components in the process chamber 11.

Among the components in the plasma processing apparatus 10, the shower head 16 and the stage 12 are components to which a bias voltage can be applied by a direct-current voltage, the HF power, or the LF power. The wafer W and the edge ring 15 placed on the stage 12 are components to which a bias voltage can be applied via the stage 12. In the case of a component to which a bias voltage can be applied, metal deposits adhering to the component can be removed by sputter etching, i.e., by applying a bias voltage to the component and thereby attracting ions to the component.

On the other hand, in the case of a component to which a bias voltage cannot be applied or cannot be applied sufficiently, ions cannot be attracted or cannot be sufficiently attracted to the component, and therefore the effect of sputter etching is low. Therefore, plasma etching is performed on such a component using a corrosive gas containing chlorine (Cl). In this case, as illustrated in "COMPARATIVE EXAMPLE" in FIG. 2, a metal deposit R adhering to a second component such as the insulator 40 reacts with chlorine and is removed. However, first components such as the shower head 16 and the edge ring 15 in the process chamber 11 are also etched and damaged mainly due to the reaction between chlorine and Si.

For this reason, in the present embodiment, as illustrated in "EMBODIMENT" in FIG. 2, before removing the metal deposit R with plasma of a gas containing a chlorine gas (halogen gas), the surfaces of the shower head 16 and the edge ring 15 are oxidized with $O_2$ plasma to form silicon dioxide films on the surfaces of the shower head 16 and the edge ring 15 (oxidation step). This makes it possible to protect the surfaces of the shower head 16 and the edge ring 15 with oxide layers 15a and 16a in the next step of removing the metal deposit R (treatment step).

Protecting the first components such as the shower head 16 and the edge ring 15 with the oxide layers 15a and 16a makes it possible to remove the metal deposit R adhering to the second component such as the insulator 40 while reducing wear of the first components.

The upper row of FIG. 3 illustrates SEM images of the shapes of deposits adhered to the surfaces of the shower head 16 and the insulator 40 when a chip including, from bottom to top, a silicon film 203, a silicon dioxide film 202, and an alumina film 201 is attached to the surface of each of the shower head 16 and the insulator 40, and an aluminum substrate is plasma-etched. The lower row of FIG. 3 indicates the results of measuring the types and amounts of elements constituting deposits 200 adhering to the surfaces of the shower head 16 and the insulator 40. The types and amounts of the elements were measured using X-ray photoelectron spectroscopy (XPS).

The results indicate that the shape of the deposit 200 on the shower head 16 is different from the shape of the deposit 200 on the insulator 40. The results also indicate that both of the deposit 200 on the shower head 16 and the deposit 200 on the insulator 40 include large amounts of aluminum (Al) and fluorine (F). Particularly, about 30% of each deposit 200 is aluminum. However, the composition ratios in the deposits 200 are different from each other. For the above reasons, in the plasma processing method described below, the surfaces of second components such as the insulator 40 at the floating potential and the deposit shield 42 at the ground potential are treated to remove the deposits 200 adhering to the surfaces (hereafter, this step may also be referred to as a "treatment step").

In the treatment step, while the deposit 200 adhering to the insulator 40 is removed as a result of reaction with a gas containing a halogen gas, mainly a chlorine gas may react with silicon in a first component such as the shower head 16 and wear the first component. Thus, the first component may be damaged.

To prevent this problem, before the treatment step, an oxidation step is performed to oxidize the surface of the shower head 16 with $O_2$ plasma and form an oxide layer on the surface. This step makes it possible to remove the deposit 200 adhering to the second component such as the insulator 40 while preventing the first component such as the shower head 16 from being worn.

In the oxidation step, the surface of the first component is oxidized to form a silicon dioxide film on the surface. That is, an oxide layer is formed on the surface of the first component by modifying the surface of the first component.

<Plasma Processing>

An example of a plasma processing process according to an embodiment is described with reference to the flowchart of FIG. 4. This process is controlled by the controller 30. When the process is started, the controller 30 carries the wafer W having a film containing a metal material into the process chamber 11 (step S1). Specifically, the controller 30 causes a conveying arm (not shown) to carry the wafer W into the process chamber 11 and place the wafer W on the stage 12.

An example of the film formed on the wafer W and containing a metal material may be a metal-containing mask such as a TiN mask or a tungsten (W) mask formed on a silicon dioxide film that is an example of an etching target film. Another example of the film containing a metal material may be a metal-containing etching-target film such as an alumina film or a titanium oxide (TiO) film. Still another example of the film containing a metal material may be a metal-containing base film that is exposed when an etching target film is etched. An example of the metal-containing base film is a tungsten film below a silicon dioxide film.

Next, the controller 30 etches the wafer W (step S2). For example, the controller 30 converts a $C_4F_8$ gas, which is an example of a CF gas, into plasma mainly using the HF power, and etches with the plasma an etching target film such as a silicon dioxide film through a metal mask formed on the wafer W. The types of the gas used for etching, the mask, and the etching target film are not limited to those described above.

Next, the controller 30 carries the processed wafer W out of the process chamber 11 (step S3). Next, the controller 30 carries a dummy wafer into the process chamber 11 and places the dummy wafer on the stage 12 (step S4). The dummy wafer protects the surface of the stage 12 from plasma generated in subsequent steps. However, step S4 may be omitted.

Next, the controller 30 converts an oxygen gas into plasm mainly using the HF power to form silicon oxide layers on the surfaces of the shower head 16 and the edge ring 15 with the plasma (step S5: oxidation step). As a result, protective films made of the oxide layers are formed on the surfaces of the shower head 16 and the edge ring 15.

Next, the controller 30 supplies a halogen-containing gas into the process chamber 11 and converts the halogen-containing gas into plasma mainly using the HF power to treat the inside of the process chamber 11 with the plasma (step S6: treatment step). As a result, all the components in the process chamber 11 are treated. For example, the surfaces of the insulator 40, the deposit shield 42, the baffle plate 21, the protective part 44, and the grounding part 43 are treated, and metal deposits adhering to the surfaces of these components are removed.

In the treatment step (step S6), a metal contained in the deposits adhering to the surfaces of the insulator 40, the deposit shield 42, the baffle plate 21, the protective part 44, and the grounding part 43 is halogenated and removed. For example, when a wafer W including a silicon dioxide film formed below a TiN mask is processed with plasma, the metal deposit contains Ti. In this case, the controller 30 supplies, for example, a $BCl_3$ gas as a halogen-containing gas into the process chamber 11, converts the $BCl_3$ gas into plasma mainly using the HF power, and treats the surfaces of components such as the insulator 40 with the plasma. The chemical reaction that occurs at this step is indicated below.

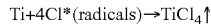

$Ti+4Cl^*(radicals) \rightarrow TiCl_4 \uparrow$

In this way, a metal contained in metal deposits adhering to the surfaces of components such as the insulator 40 is halogenated and evaporated. As a result, the metal deposits adhering to the surfaces of components such as the insulator 40 are removed.

Next, the controller 30 determines whether to repeat the oxidation step (step S5) and the treatment step (step S6). Specifically, the controller 30 determines whether steps S5 and S6 have been repeated a predetermined number of times. When determining that steps S5 and S6 have not been repeated the predetermined number of times, the controller 30 returns to step S5 and repeats the oxidation step (step S5) and the treatment step (step S6). For example, oxide layers, which are resistant to chlorine, still wear to some extent. Therefore, steps S5 and S6 are repeated to remove metal deposits and to form oxide layers again before the oxide layers disappear. The predetermined number of times may be one or more.

When determining at step S7 that steps S5 and S6 have been repeated the predetermined number of times, the controller 30 removes the oxide layers on the surfaces of the shower head 16 and the edge ring 15 (step S8). Then, the controller 30 ends the process.

In the oxidation step (step S5), at least one of the LF power for ion attraction supplied from the second radio-frequency power supply 18 and the direct-current voltage supplied from the variable direct-current power supply 41 is preferably applied to the first component. Also, a direct-current voltage may be applied to the edge ring 15 from a mechanism for supplying the direct-current voltage to the edge ring 15. This makes it possible to facilitate oxidation of the surface of the first component.

The plasma processing method described above makes it possible to remove a metal deposit on the surface of the second component such as the insulator 40 while reducing the wear of silicon forming the first component such as the shower head 16.

Also, reducing the wear of the first component makes it possible to reduce the amount of silicon flying from the first component to the second component. This in turn reduces the amount of the metal deposit adhering to the surface of the second component, and thereby makes it easier to remove the metal deposit on the surface of the second component.

<Results of Experiments>

FIG. 5 is a table indicating the results of experiments. FIG. 5 indicates the states of the surface of the shower head 16 as an example of a first component and the surfaces of the insulator 40 and the deposit shield 42 as examples of second components. In the experiments, the shower head 16 formed of polysilicon was used. As an example of a metal deposit, alumina was formed on the surfaces of the shower head 16, the insulator 40, and the deposit shield 42. After performing plasma processing, the etching rate of polysilicon on the surface of the first component and the etching rates of alumina on the surfaces of the second components were measured. Also, based on the measured values, the selectivity between alumina and polysilicon was calculated. A higher selectivity value indicates a lower etching rate of polysilicon relative to the etching rate of alumina.

Figure 4:
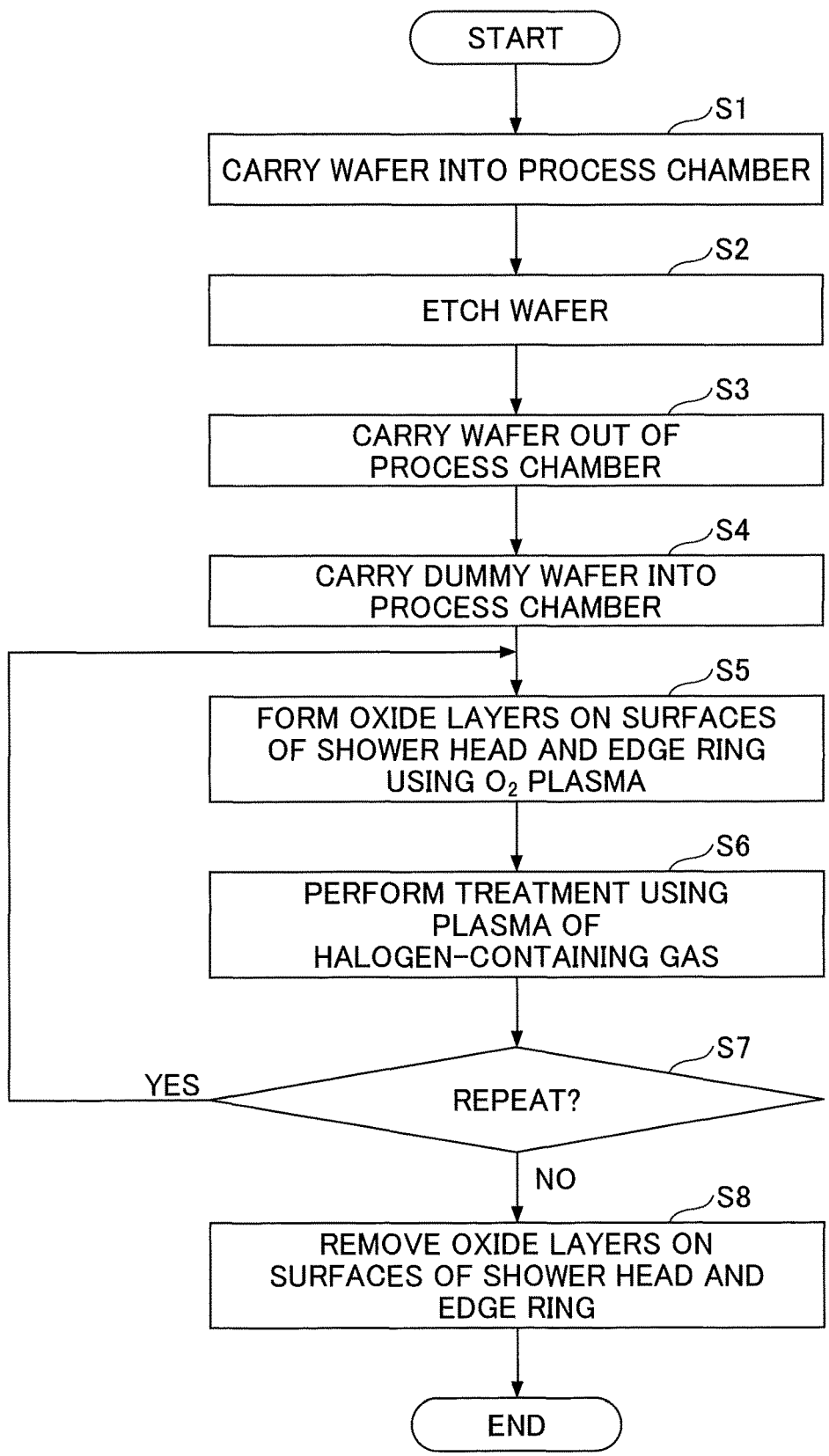
FIG. 4 is a flowchart illustrating an example of a plasma processing process according to an embodiment.

In the experiment according to the present embodiment (EMBODIMENT), the treatment step (step S6) was performed after the oxidation step (step S5) illustrated in FIG. 4. On the other hand, in the experiment according to the comparative example (COMPARATIVE EXAMPLE), the treatment step was performed without performing the oxidation step.

As the results indicate, the etching rate of polysilicon on the surface of the shower head 16 in the experiment according to the present embodiment is less than that in the experiment according to the comparative example. This indicates that the present embodiment can reduce the wear of silicon. Also, the etching rates of alumina (metal deposit) on the insulator 40 and the deposit shield 42 in the experiment according to the present embodiment are substantially the same as those in the experiment according to the comparative example. Thus, the plasma processing method of the present embodiment can at the same time reduce the etching rate of polysilicon on the first component and increase the etching rate of the metal deposit on the second component. In other words, the present embodiment can improve the selectivity of the shower head 16.

The above results indicate that forming the oxide layer by oxidizing the surface of the first component according to the present embodiment can make the surface of the first component less likely to be etched in the treatment step for removing the metal deposit on the surface of the second component. This in turn increases the etching rate of the metal deposit relative to the etching rate of the first component and improves the selectivity of the first component.

Even when a direct-current voltage or the LF power is applied to the second component such as the insulator 40 having a floating potential or the deposit shield 42 having a ground potential, a sufficient bias voltage is not applied to the second component. Accordingly, the potential difference between plasma and the second component is insufficient to sputter the second component, and the sputtering effect is low or no sputtering effect is generated. For this reason, in the treatment step, the metal deposit on the surface of the second component is chemically removed mainly by the action of radicals in a halogen-containing gas. To prevent the halogen-containing gas from wearing silicon forming the first component, an oxidation step is performed before the treatment step to form an oxide layer on the surface of the first component. This method makes it possible to remove the metal deposit formed on the surface of the second component while preventing the wear of silicon forming the first component.

<Variation>

Figure 6:
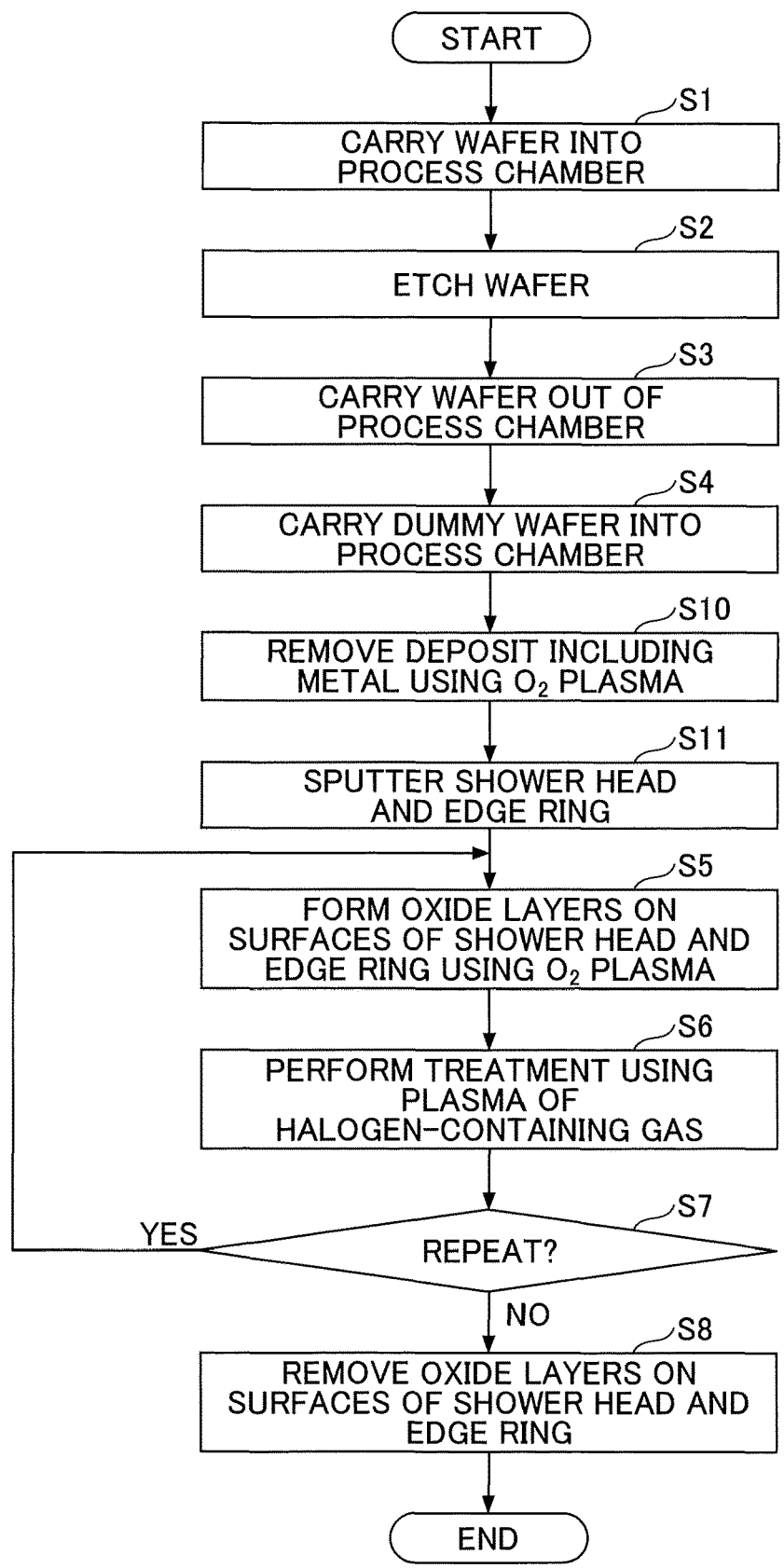
FIG. 6 is a flowchart illustrating a variation of the plasma processing process.

Next, a plasma processing process according to a variation of the embodiment is described with reference to FIG. 6. FIG. 6 is a flowchart illustrating a plasma processing process according to a variation of the embodiment. The same step numbers are assigned to steps that are the same as the steps in the plasma processing process illustrated in FIG. 4, and the descriptions of those steps are omitted or simplified.

The plasma processing process of FIG. 6 is different from the plasma processing process of FIG. 4 in that cleaning steps (steps S10 and S11) are performed after the wafer W is etched at step S2, the wafer W is carried out of the process chamber 11 at step S3, and a dummy wafer is carried into the process chamber 11 at step S4. However, step S4 may be omitted.

That is, in the plasma processing process according to the variation, cleaning steps are performed before the oxidation step (step S5) to remove metal deposits adhered to the surfaces of the first components such as the shower head 16 as a result of the etching step (step S2).

As a cleaning step, the controller 30 removes metal deposits adhering to all components in the process chamber 11 by using plasma of an oxygen gas (step S10). Next, the controller 30 applies at least one of the LF power for ion attraction, the HF power for plasma generation, and the direct-current voltage from the variable direct-current power supply 41 to the shower head 16 and the edge ring 15. As a result, ions are attracted to the first components including the shower head 16 and the edge ring 15, and the metal deposits adhering to the shower head 16 and the edge ring 15 are removed by sputtering (step S11).

In the variation, the oxidation step (step S5) and the treatment step (step S6) are performed after the cleaning step using O$_2$ plasma (step S10) and the cleaning step by sputtering (step S11).

As described above, the plasma processing method according to the variation of the embodiment also makes it possible to remove a metal deposit on the surface of the second component such as the insulator 40 while reducing the wear of silicon forming the first component such as the shower head 16.

The cleaning step S10 may be omitted when the metal product includes neither C (carbon) nor F (fluorine). Also, the cleaning step S10 and the oxidation step S5 may be performed as a single step or may be performed as separate steps. However, performing the cleaning step S10 separately from the oxidation step S5 as in this variation makes it possible to optimize the process conditions for each of the cleaning step S10 and the oxidation step S5.

Further, the order of execution of the cleaning step S10 and the sputtering step S11 may be changed, or these steps may be combined into one step.

A plasma processing method and a plasma processing apparatus according to embodiments of the present invention are described above. However, the present invention is not limited to the specifically disclosed embodiments, and variations and modifications may be made without departing from the scope of the present invention. Also, the above-described embodiments and variations may be combined in any appropriate manner as long as they do not conflict with each other.

The plasma processing method of the above embodiment may also be performed by any appropriate apparatus other than the plasma processing apparatus 10. For example, the plasma processing method of the above embodiment may be performed by an apparatus that employs any one of Capacity Coupled Plasma (CCP), Inductively Coupled Plasma (ICP), Radial Line Slot Antenna (RLSA), Electron Cyclotron Resonance Plasma (ECR), and Helicon Wave Plasma (HWP).

What is claimed is:

1. A plasma processing method performed by a plasma processing apparatus including
   a process chamber,
   a conductive first component disposed in the process chamber, at least a surface of the first component being covered with a conductive silicon material, and
   a second component disposed in the process chamber, the second component being at a ground potential or a floating potential with respect to an electric potential of plasma,
   the method comprising:
   forming an oxide layer on the surface of the first component by converting an oxygen-containing gas into plasm;
   treating a surface of the second component by converting a halogen-containing gas into plasm; and
   removing the oxide layer after the treating.

2. The plasma processing method as claimed in claim 1, wherein the forming of the oxide layer includes applying at least one of a radio-frequency power or a direct-current voltage for ion attraction to the first component.

3. The plasma processing method as claimed in claim 1, further comprising:
   carrying a substrate including a metal-containing film into the process chamber; and
   etching the substrate,
   wherein the forming of the oxide layer and the treating are performed after the etching.

4. The plasma processing method as claimed in claim 3, further comprising:
   carrying the substrate out of the process chamber after the etching and before the forming of the oxide layer.

5. The plasma processing method as claimed in claim 3, further comprising:
   removing a metal-containing deposit adhered to the surface of the first component as a result of the etching after the etching and before the forming of the oxide layer.

6. The plasma processing method as claimed in claim 3, wherein the treating is performed to remove a metal-containing deposit adhered to the surface of the second component as a result of the etching.

7. The plasma processing method as claimed in claim 1, wherein the treating is performed to halogenate and remove a metal contained in a deposit adhered to the surface of the second component.

8. The plasma processing method as claimed in claim 1, wherein the first component is at least one of an upper electrode and an edge ring disposed to surround a substrate.

9. The plasma processing method as claimed in claim 1, wherein the second component is at least one of an insulator disposed around an upper electrode, a deposit shield, a baffle plate, a protective part, and a grounding part.

10. The plasma processing method as claimed in claim 1, wherein the forming of the oxide layer and the treating are repeated a predetermined number of times.

11. A plasma processing apparatus, comprising:
    a process chamber;
    a conductive first component disposed in the process chamber, at least a surface of the first component being covered with a conductive silicon material;
    a second component disposed in the process chamber, the second component being at a ground potential or a floating potential with respect to an electric potential of plasma; and a controller configured to perform a process including
   forming an oxide layer on the surface of the first component by converting an oxygen-containing gas into plasm,
   treating a surface of the second component by converting a halogen-containing gas into plasm, and
   removing the oxide layer after the treating.

\* \* \* \* \*